(12) United States Patent
Noh et al.

(10) Patent No.: US 9,064,832 B2
(45) Date of Patent: Jun. 23, 2015

(54) ARRAY SUBSTRATE FOR LIQUID CRYSTAL DISPLAY DEVICE AND METHOD OF FABRICATING THE SAME

(75) Inventors: Young-Hoon Noh, Gyeonggi-do (KR); Ho-Cheol Kang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 523 days.

(21) Appl. No.: 12/830,785

(22) Filed: Jul. 6, 2010

(65) Prior Publication Data

US 2011/0006290 A1     Jan. 13, 2011

(30) Foreign Application Priority Data

Jul. 7, 2009    (KR) ........................ 10-2009-0061485

(51) Int. Cl.
*H01L 21/8234*     (2006.01)
*H01L 27/32*      (2006.01)

(52) U.S. Cl.
CPC ........ *H01L 27/3274* (2013.01); *H01L 27/3262* (2013.01)

(58) Field of Classification Search
CPC .. H01L 51/0545; H01L 27/124; G02F 1/1368
USPC ............ 438/99, 608, 610, 479; 257/E21.002, 257/E21.411, E21.025
See application file for complete search history.

(56) References Cited

U.S. PATENT DOCUMENTS

| | | | |
|---|---|---|---|
| 5,933,741 A * | 8/1999 | Tseng ........................... | 438/305 |
| 5,939,241 A * | 8/1999 | Leu et al. ...................... | 430/318 |
| 6,927,814 B2 * | 8/2005 | Lee et al. ...................... | 349/106 |
| 7,342,247 B2 * | 3/2008 | Lee et al. ......................... | 257/40 |
| 7,842,538 B2 * | 11/2010 | Lee et al. .......................... | 438/99 |
| 7,955,521 B2 * | 6/2011 | Park et al. .................... | 252/79.1 |
| 2002/0022364 A1 * | 2/2002 | Hatta et al. .................... | 438/673 |
| 2007/0052025 A1 * | 3/2007 | Yabuta .......................... | 257/347 |
| 2007/0090362 A1 * | 4/2007 | Ahn et al. ........................ | 257/66 |
| 2007/0268438 A1 * | 11/2007 | Nakamura et al. ............ | 349/138 |
| 2008/0012014 A1 * | 1/2008 | Park et al. ........................ | 257/40 |
| 2010/0308317 A1 * | 12/2010 | Ahn et al. ........................ | 257/40 |

* cited by examiner

*Primary Examiner* — Bradley K Smith
*Assistant Examiner* — David Goodman
(74) *Attorney, Agent, or Firm* — Morgan, Lewis & Bockius LLP

(57) ABSTRACT

An array substrate for a display device, including a substrate having a pixel region and a switching region, a source electrode and a drain electrode on the switching region of the substrate, ends of the source and drain electrodes having tapered edges, a pixel electrode in the pixel region of the substrate, the pixel electrode being connected to the drain electrode, an organic semiconductor layer on the source and drain electrodes, the organic semiconductor layer completely contacting tapered edges and a top surface of each of the source and drain electrodes, a first insulating layer on the organic semiconductor layer, and a gate electrode on the first insulating layer.

6 Claims, 10 Drawing Sheets

FIG. 8

ARRAY SUBSTRATE FOR LIQUID CRYSTAL DISPLAY DEVICE AND METHOD OF FABRICATING THE SAME

The present application claims the benefit of Korean Patent Application No. 2009-0061485, filed in Korea on Jul. 7, 2009, which is hereby incorporated by reference.

BACKGROUND OF THE INVENTION

1. Field of the Invention

The present invention relates to a liquid crystal display device, and more particularly, to an array substrate for a liquid crystal display device, which includes an organic semiconductor layer as a switching element being capable of reducing contact resistance between the organic semiconductor layer and each of the source and drain electrodes, and a method of fabricating the same.

2. Discussion of the Related Art

Recently, as society has entered into an information age, a field of display devices that represents all sorts of electrical signals as visual images has developed rapidly. Moreover, since the LCD device is light weight, thin, and requires low power consumption, the LCD device has been widely used as a substitute for a cathode-ray tube type display device.

A related art liquid crystal display (LCD) device uses optical anisotropy and polarization properties of liquid crystal molecules. The liquid crystal molecules have a definite alignment direction as a result of their thin and long shapes. The alignment direction of the liquid crystal molecules can be controlled by applying an electric field across the liquid crystal molecules. In other words, as the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling light transmissivity.

Since the LCD device including a thin film transistor (TFT) as a switching element, referred to as an active matrix LCD (AM-LCD) device, has excellent characteristics of high resolution and displaying moving images, the AM-LCD device has been widely used.

Figure 1:
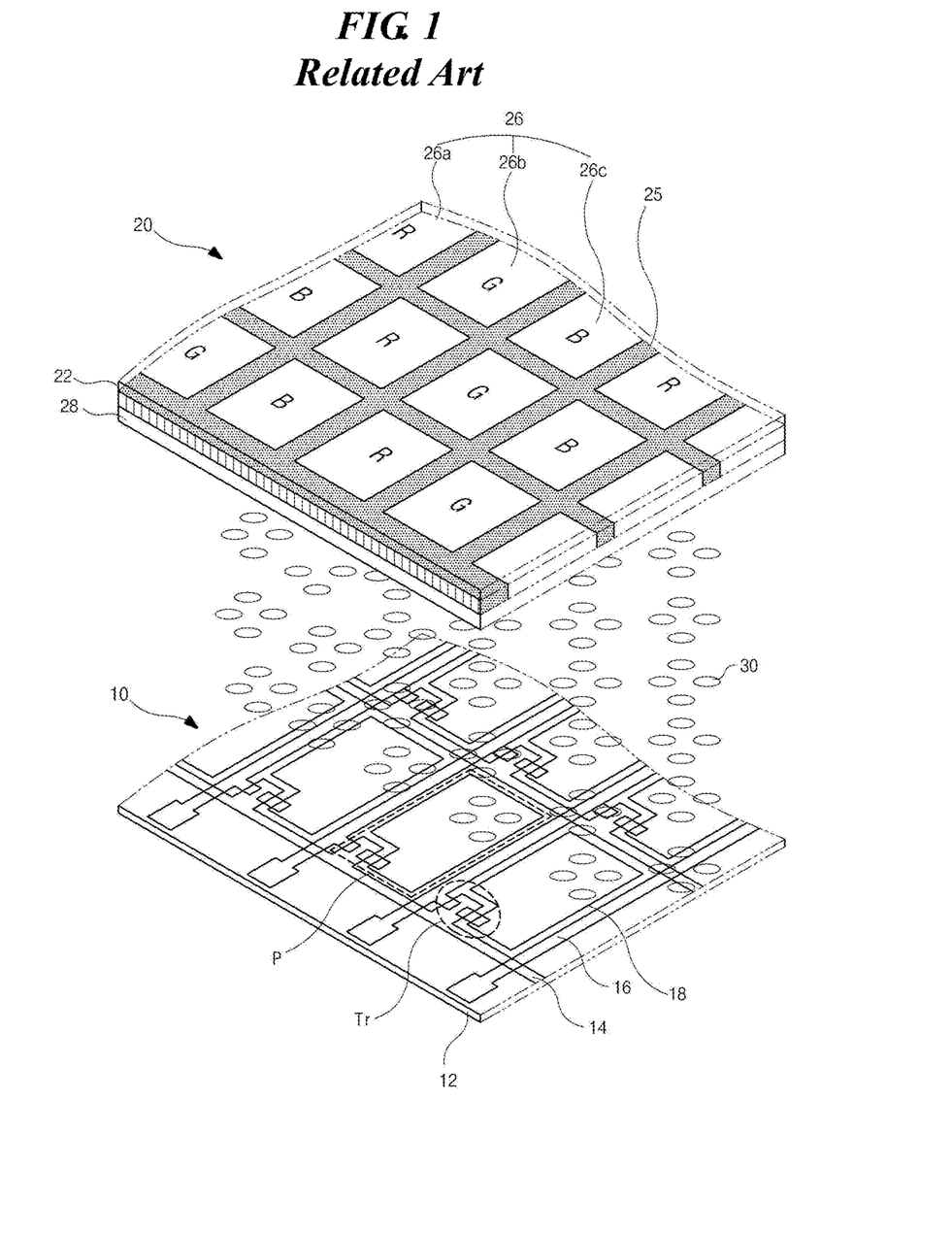
FIG. 1 is an exploded perspective view of a liquid crystal panel according to the related art.

FIG. 1 is an exploded perspective view of a related art liquid crystal panel. As shown in FIG. 1, the liquid crystal panel includes an array substrate 10, a color filter substrate 20, and a liquid crystal layer 30. The array substrate 10 and the color filter substrate 20 face each other, and the liquid crystal layer 30 is interposed therebetween.

The array substrate 10 includes a first substrate 12, a gate line 14, a data line 16, a thin film transistor (TFT) Tr, and a pixel electrode 18. The gate and data lines 14 and 16 are formed on the first substrate 12 and cross each other to define a pixel region P. The TFT Tr is formed at a crossing portion of the gate and data lines 14 and 16. The pixel electrode 18 is formed in the pixel region P and connected to the TFT Tr.

The color filter substrate 20 includes a second substrate 22, a black matrix 25, a color filter layer 26, and a common electrode 28. The black matrix 25 is formed on the second substrate 22 and has a lattice shape. The black matrix 25 corresponds to a non-display region of the first substrate 12. The non-display region of the first substrate 12 includes the gate and data lines 14 and 16 and the TFT Tr. The color filter layer 26 corresponds to the pixel region P and includes red, green, and blue color filter patterns 26a, 26b, and 26c. The common electrode 28 is formed on the black matrix 25 and the color filter layer 28. The common electrode 28 generates an electric field with the pixel electrode 18 such that the liquid crystal layer 30 is driven by the electric field.

Though not shown, a seal pattern is formed along edges of the first and second substrates 12 and 22. The seal pattern prevents the liquid crystal layer 30 from overflowing. In addition, first and second alignment layers may be formed between the first substrate 12 and the liquid crystal layer 30 and between the second substrate 22 and the liquid crystal layer 30. A polarization plate may be formed on an outer surface of one of the first and second substrates 12 and 22. A backlight assembly is formed on a rear side of the first substrate 12 to apply light into the liquid crystal panel. When a scan signal is applied to the TFT Tr through the gate line 14 to turn on the TFT Tr, an image signal is applied to the pixel electrode 18 through the data line 16 such that an electric field is generated between the pixel electrode 18 and the common electrode 28. As a result, the liquid crystal molecules in the liquid crystal layer 30 are driven by the electric field to display images.

Generally, a glass plate is used for the first and second substrates 12 and 22. However, recently, a flexible plate, such as a plastic plate, is used for the first and second substrates 12 and 22 because the flexible plate is light and flexible.

Unfortunately, since a process of fabricating an array substrate is performed under a temperature higher than about 200° C., it is very difficult for the flexible plate to be a substitute for the glass plate. So, the array substrate is made of the glass substrate, and the color filter substrate is made of the flexible substrate. When processes of forming a metal layer, a gate insulating layer, a passivation layer are performed under a temperature lower than 200° C., the TFT does not deteriorate. However, when a semiconductor layer is made of amorphous silicon under such a lower temperature, the TFT does deteriorate. To resolve these problems, a method of fabricating the array substrate under a temperature lower than about 200° C. by forming the TFT using an organic semiconductor material is suggested.

Since the lower temperature process for the array substrate uses the coating apparatus, which is cheaper than a vacuum depositing apparatus, there is an advantage in the reduction of production costs. The lower temperature process is useful for not only the plastic substrate but also the glass substrate.

When processes of forming a metal layer, a gate insulating layer, and a passivation layer are performed at a temperature lower than 200° C., the TFT does not deteriorate. However, when a semiconductor layer is made of amorphous silicon under such a lower temperature, the TFT does deteriorate. To resolve these problems, a method of fabricating the array substrate at a temperature lower than about 200° C. by forming the TFT using an organic semiconductor material is suggested.

The TFT is classified into a top contact type and a bottom contact type depending on a contact relation between each of the source and drain electrodes and the organic semiconductor layer. In the top contact type TFT, the organic semiconductor layer is disposed on the source and drain electrodes such that a bottom surface of the organic semiconductor layer contacts a top surface of each of the source and drain electrodes. On the other hand, in the bottom contact type TFT, the source and drain electrodes are disposed on the organic semiconductor layer such that a top surface of the organic semiconductor layer contacts a bottom surface of each of the source and drain electrodes.

When the organic semiconductor material, which is formed through a coating process, is exposed to a developer for a photoresist or an etchant for etching a metal layer, a property of the semiconductor layer deteriorates. Accordingly, the semiconductor layer of the organic semiconductor material is formed after a source and drain electrodes forming process, since the source and drain electrodes forming process requires a patterning step using an etchant. That is, the bottom contact type is useful for the TFT using the organic semiconductor material.

Unfortunately, the bottom contact type organic TFT has a disadvantage; namely, a contact resistance between each of the source and drain electrodes and the organic semiconductor layer ends of the source and drain electrodes have a reverse-tapered shape. That is, a side surface of the ends of the source and drain electrodes have an obtuse angle with respect to a top surface of the substrate.

Figure 2:
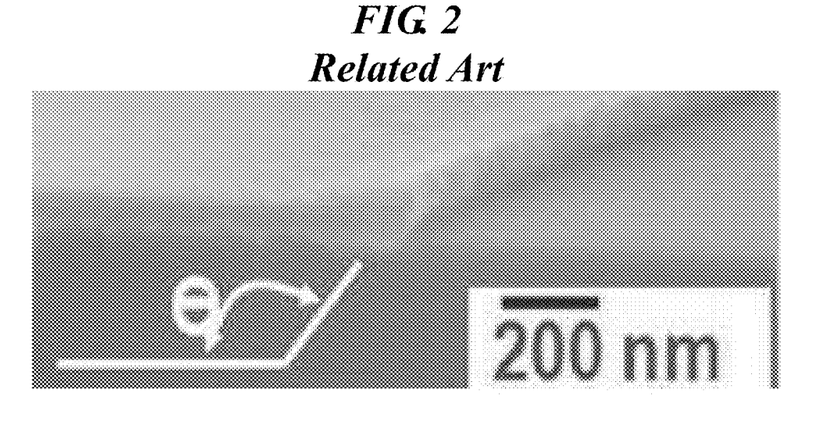
FIG. 2 is a picture illustrating an end of a source electrode of a TFT including an organic semiconductor layer according to the related art.

FIG. 2 is a picture showing an end of a source electrode in the related art TFT including an organic semiconductor layer.

As shown in FIG. 2, an end of a source electrode has a reverse-tapered shape with respect to a surface of a substrate. In this case, an organic semiconductor layer, which is formed on the source electrode by a coating apparatus, does not have a coating thickness uniformity. Particularly, the organic semiconductor layer has a larger thickness at the end of the source electrode such that a boundary region is generated in the organic semiconductor layer. As a result, there is a problem in properties, e.g., mobility, since the boundary region serves as barrier against movement of carriers. Accordingly, a contact resistance between each of the source and drain electrodes and the organic semiconductor layer is increased.

In addition, when the substrate, where the source and drain electrodes are formed, is transported for a process of forming the organic semiconductor layer, undesired particles may be attached into the reverse-tapered shape end of the source and drain electrodes. Particularly, the undesired particles in a space between the end of the source electrode or the drain electrode and the substrate are not removed by a cleaning process. Defects occur due to the undesired particles.

SUMMARY OF THE INVENTION

Accordingly, the present invention is directed to an array substrate for a liquid crystal display device and a method of fabricating the same that substantially obviate one or more of the problems due to limitations and disadvantages of the related art.

An object of the present invention is to provide an array substrate having a relatively low contact resistance between each of source and drain electrodes and an organic semiconductor layer and a method of the array substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the array substrate for a liquid crystal display device and method for fabricating the same includes an array substrate for a display device, including a substrate having a pixel region and a switching region, a source electrode and a drain electrode on the switching region of the substrate, ends of the source and drain electrodes having tapered edges, a pixel electrode in the pixel region of the substrate, the pixel electrode being connected to the drain electrode, an organic semiconductor layer on the source and drain electrodes, the organic semiconductor layer completely contacting tapered edges and a top surface of each of the source and drain electrodes, a first insulating layer on the organic semiconductor layer, and a gate electrode on the first insulating layer.

In another aspect of the present invention, the array substrate for a liquid crystal display device and method for fabricating the same includes a method of fabricating an array substrate for a display device, comprising the steps of forming a substrate having a pixel region and a switching region, forming a source electrode and a drain electrode on the switching region of the substrate, ends of the source and drain electrodes having tapered edges, forming a pixel electrode in the pixel region of the substrate, the pixel electrode being connected to the drain electrode, forming an organic semiconductor layer on the source and drain electrodes, the organic semiconductor layer completely contacting tapered edges and a top surface of each of the source and drain electrodes, forming a first insulating layer on the organic semiconductor layer, and forming a gate electrode on the first insulating layer.

In another aspect of the present invention, the array substrate for a liquid crystal display device and method for fabricating the same includes a method of fabricating an array substrate for a liquid crystal display device, comprising forming a substrate having a pixel region and a switching region, forming a data line on the substrate, forming a source electrode and a drain electrode on the switching region of the substrate, the source electrode extending from the data line and being separated from the drain electrode, ends of the source and drain electrodes having an angle smaller than 90 degrees with respect to a surface of the substrate, forming a pixel electrode in the pixel region of the substrate, the pixel electrode being connected to the drain electrode, forming an organic semiconductor layer on the source and drain electrodes, the organic semiconductor layer contacting an inside end of each of the source and drain electrodes, forming a gate insulating layer on the organic semiconductor layer, forming a gate electrode on the gate insulating layer, forming a gate line connected to the gate electrode and crossing the data line to define the pixel region, and forming a first passivation layer on the gate electrode and the data line, a gate contact hole that exposes the gate electrode and an opening that exposes the pixel electrode being formed in the first passivation layer, the gate line being disposed on the second insulating layer and connected to the gate electrode through the gate contact hole.

In another aspect of the present invention, the array substrate for a liquid crystal display device and method for fabricating the same includes a method of fabricating an array substrate for a liquid crystal display device, comprising the steps of forming a gate line and a gate electrode on a substrate having a pixel region and a switching region, the gate electrode extending from the gate line and positioned in the switching region, forming a gate insulating layer on the gate line and the gate electrode by depositing an organic insulating material, forming a data line, a source electrode and a drain electrode on the gate insulating layer, the source electrode extending from the data line and spaced apart from the drain electrode, ends of the source and drain electrodes having an angle smaller than 90 degrees with respect to a surface of the substrate, the source and drain electrodes positioned in the switching region, forming a pixel electrode on the gate insulating layer and in the pixel region, the pixel electrode connected to the drain electrode, forming an organic semiconductor layer on the source and drain electrodes and a first passivation layer on the organic semiconductor layer, and forming a second passivation layer on the first insulating layer and including an opening, wherein the pixel electrode is exposed through the opening.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 3:
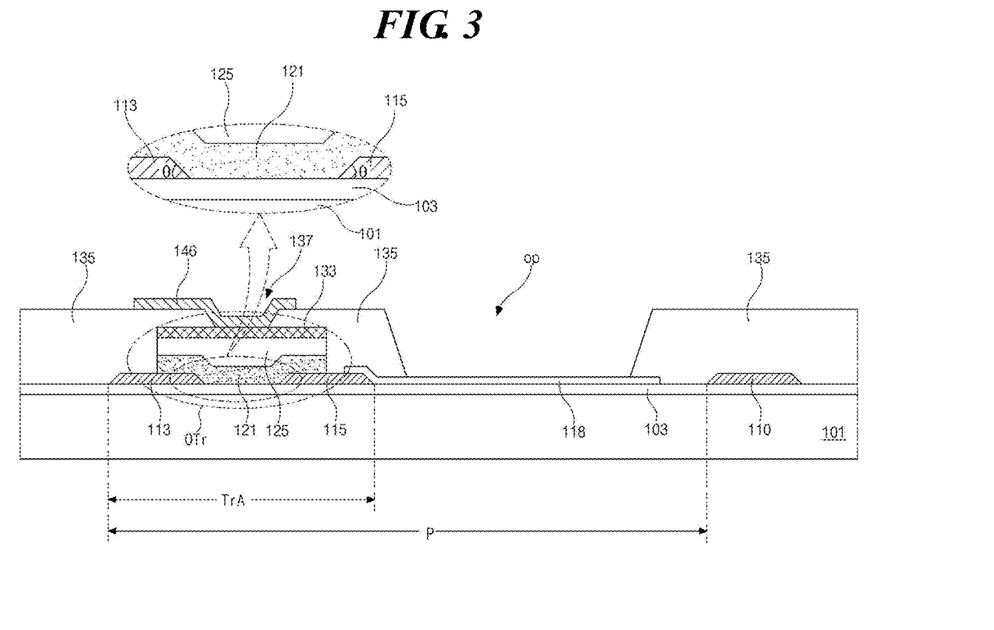
FIG. 3 is a cross-sectional view illustrating an array substrate for an LCD device having an organic TFT according to a first exemplary embodiment of the present invention.

FIG. 3 is a cross-sectional view of an array substrate for an LCD device having an organic TFT according to a first exemplary embodiment of the present invention.

As shown in FIG. 3, a buffer layer 103 is disposed on an entire surface of a substrate 101. The substrate 101 is transparent. For example, the substrate 101 may be formed of glass or plastic. The buffer layer 103 may be formed of an inorganic insulating material. The buffer layer 103 is formed to increase adhesiveness with an organic semiconductor layer 121 being formed on the buffer layer 103. Alternatively, the buffer layer 103 may be omitted depending on a material of the substrate 101. When the substrate 101 is formed of glass, the buffer layer 103 may be required because an adhesiveness between the buffer layer 103 of the inorganic insulating material and the organic semiconductor layer 121 is stronger than that between the substrate 101 of glass and the organic semiconductor layer 121. A region where an organic TFT OTr is formed is defined as a switching region TrA.

A data line 110 along a first direction, a source electrode 113 extending from the data line 110 and a drain electrode 115 spaced apart from the source electrode 110 are disposed on the buffer layer 103. Each of the data line 110, the source electrode 113, and the drain electrode 115 is formed of a first metallic material. For example, gold (Au), silver (Ag), aluminum (Al), Al alloy, copper (Cu), Cu alloy, nickel (Ni) or molybdenum-titanium alloy (MoTi) may be used. The aluminum alloy may be aluminum neodymium (AlNd). The source and drain electrodes 113 and 115 are positioned in the switching region TrA. Ends of each of the source and drain electrodes 113 and 115 have a tapered shape. Namely, a side surface of the ends of the source and drain electrodes 113 and 115 has an angle θ that is less than 90 degrees. For example, angle θ has a range of about 10 to 70 degrees with respect to a surface of the buffer layer 103 or the substrate 101. A detailed method for the source and drain electrodes 113 and 115 having the tapered shape will be explained later.

A pixel electrode 118 is positioned in a pixel region P and disposed on the buffer layer 103. The pixel electrode 118 contacts an end of the drain electrode 115. The pixel electrode 118 is formed of a transparent conductive material. For example, indium-tin-oxide (ITO) or indium-zinc-oxide (IZO) may be used. Since the end of the drain electrode 115 has a tapered shape, a contact property between the drain electrode 115 and the pixel electrode 118 is improved. Namely, since the end of the drain electrode in the related art array substrate has a reverse-tapered shape, there is a space between the drain electrode and the substrate or the buffer layer such that a contact property between the drain electrode and the pixel electrode is also deteriorated. However, since there is no space between the drain electrode 115 and the buffer layer 103 of the present embodiment, the pixel electrode 118 closely contacts the drain electrode 115 such that a contact property between the drain electrode 115 and the pixel electrode 118 is improved.

An organic semiconductor layer 121, which is formed of an organic semiconductor material, such as pentacene or polythiophene, is disposed on the source and drain electrodes 113 and 115 and the buffer layer 103. The organic semiconductor layer 121 is positioned in the switching region TrA. The organic semiconductor layer 121 contacts an inside end of the source electrode 113 and an inside end of the drain electrode 115. The organic semiconductor layer 121 contacts the buffer layer 103 exposed between the source and drain electrodes 113 and 115. The organic semiconductor layer 121 is spaced apart from the pixel electrode 118.

Since the ends of the source and drain electrodes 113 and 115 have a tapered shape, particles are perfectly removed by a cleaning process before the step of forming the organic semiconductor layer 121. Accordingly, the organic semiconductor layer 121 has good contact with each of the source and drain electrodes 113 and 115 and a uniform thickness. If the ends of the source and drain electrodes have a reverse-tapered shape, there is an empty space between each of the ends of the source and drain electrodes and the buffer layer 103 such that a contact resistance between the organic semiconductor layer and each of the source and drain electrodes is increased. However, since there is no empty space between each of the ends of the source and drain electrodes 113 and 115 and the buffer layer 103 of the present embodiment, a contact area between the organic semiconductor layer 121 and each of the source and drain electrodes 113 and 115 is increased such that a contact property between the organic semiconductor layer 121 and each of the source and drain electrodes 113 and 115 is further improved.

A gate insulating layer 125 is disposed on the organic semiconductor layer 121 and in the switching region TrA. The gate insulating layer 125 has substantially the same shape and area in plane view as the organic semiconductor layer 121. Namely, the gate insulating layer 125 perfectly overlaps the organic semiconductor layer 121. The gate insulating layer 125 is formed of an organic insulating material having an excellent interface property with the organic semiconductor layer 121. For example, the gate insulating layer 125 may be formed of a fluorine-based polymer material or a copolymerized polymer material using a fluorine-based monomer.

A gate electrode 133 is disposed on the gate insulating layer 125. The gate electrode 133 has substantially the same shape and area as the gate insulating layer 125 in the plane view. In particular, the gate electrode 133 perfectly overlaps the gate insulating layer 125. The gate electrode 133 is formed of a second metallic material capable of being dry-etched. For example, the gate electrode 133 may be formed of molybdenum (Mo), chromium (Cr), or titanium (Ti). The gate electrode 133 covers a space between the source and drain electrodes 113 and 115.

A first passivation layer 135 is formed on the gate electrode 133 and the data line 110. The first passivation layer 135 is formed of an organic insulating material such as photo-acryl or polyvinyl alcohol (PVA). The first passivation layer 135 includes a gate contact hole 137 exposing the gate electrode 133. In addition, the first passivation layer 135 includes an opening exposing the pixel electrode 118.

A gate line 146 is disposed on the first passivation layer 135 and along a second direction. The gate line 146 is formed of a third metallic material. For example, gold (Au), silver (Ag), copper (Cu), molybdenum-titanium alloy (MoTi), aluminum (Al), aluminum alloy or nickel (Ni) may be used. The aluminum alloy may be aluminum neodymium (AlNd). The gate line 146 contacts the gate electrode 133 through the gate contact hole 137. In addition, the gate line 146 crosses the data line 110 to define the pixel region P.

Although not shown, a second passivation layer, which is formed of an inorganic insulating material, such as silicon oxide or silicon nitride, may be disposed on the first passivation layer 135 and under the gate line 146. The second passivation layer has substantially the same shape and area as the first passivation layer 135 in the plane view. In particular, the second passivation layer also includes a gate contact hole that exposes the gate electrode 133, and an opening that exposes the pixel electrode 118. The metallic material of the gate line 146 has a better contact property with an inorganic insulating material than an organic insulating material. Accordingly, the contact property between the gate line 146 and the first passivation layer 135 of the organic insulating material can be improved because the second passivation layer consists of inorganic insulating material. In addition, a third passivation layer, which is formed of an organic insulating material or an inorganic insulating material, may be disposed on the gate electrode 146 for preventing a corrosion of the gate line 146.

Figure 4A:
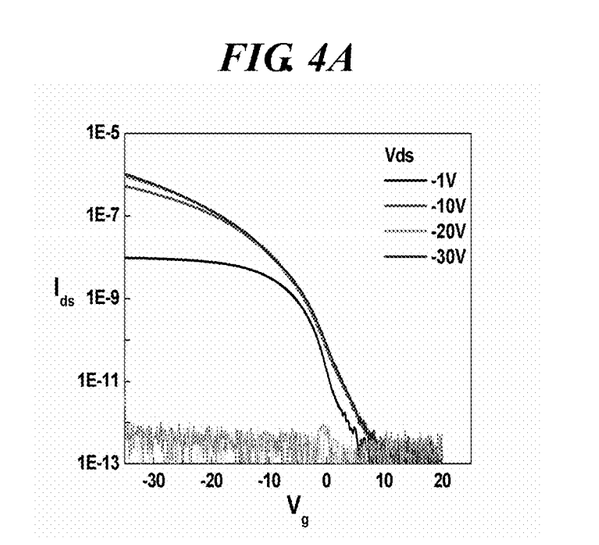
FIGS. 4A and 4B are graphs illustrating an I-V curve in the organic TFT in an array substrate according to the related art.
Figure 4B:
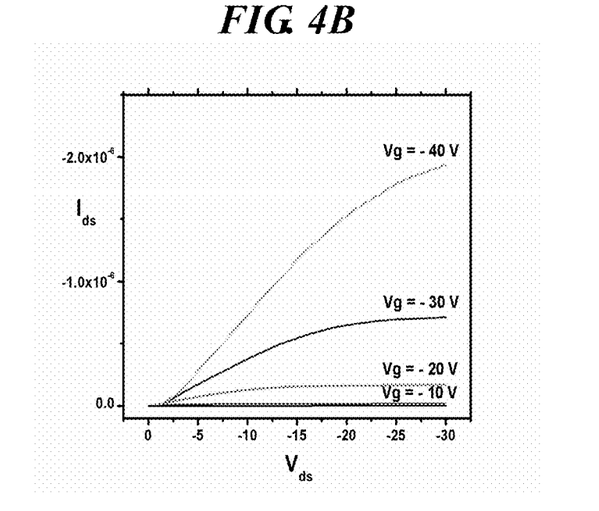
Figure 5A:
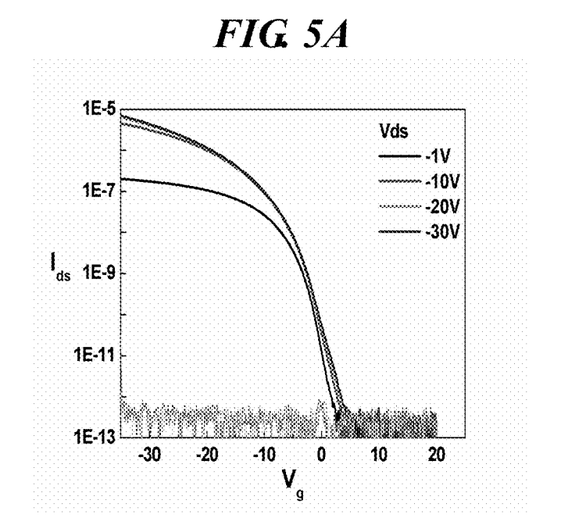
FIGS. 5A and 5B are graphs illustrating an I-V curve in an organic TFT in an array substrate according to the present invention.
Figure 5B:
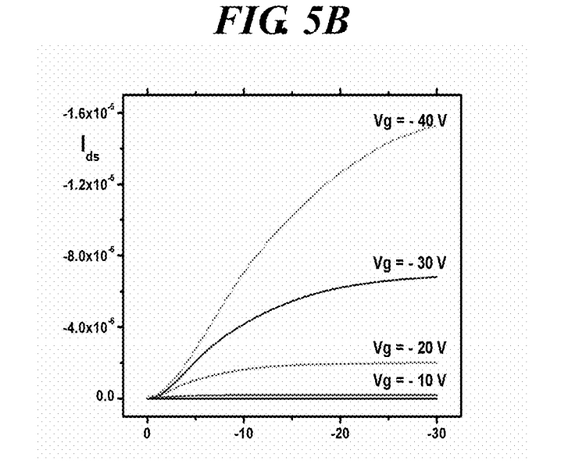

FIGS. 4A and 4B are graphs showing an I-V curve in the organic TFT of an array substrate according to the related art. FIGS. 5A and 5B are graphs showing an I-V curve of an organic TFT in an array substrate according to the present invention.

As shown in FIG. 4A, in the related art array substrate including the organic semiconductor TFT with the source and drain electrodes having reverse-tapered shape ends, the I-V curve has a gentle slope at Vg is zero. (Ion/off=1.40E+06) On the other hand, as shown in FIG. 5A, in the array substrate according to the present invention including the organic semiconductor TFT with the source and drain electrodes having tapered shape ends, the I-V curve has a sharp slope at Vg is zero. (Ion/off=5.65E+06)

In addition, as shown in FIGS. 4B and 5B, the I-V curve in the organic semiconductor TFT according to the present invention has a slop greater than that in the organic semiconductor TFT according to the related art. By experiment, mobility in the present invention is 0.56 cm2/Vs, and mobility in the related art is Mobility=0.10 cm2/Vs. Namely, the mobility in the present invention is about five times as much as that in the related art. To use the TFT as a switching element, the I-V curve of the TFT is required to be rapidly increased in the initial step where a voltage is applied to the source electrode. Accordingly, the TFT in the present invention has an improved property as compared to the TFT in the related art.

FIGS. 6A to 6F are cross-sectional views illustrating an exemplary method of fabricating an array substrate including an organic TFT according to present invention.

Figure 6A:
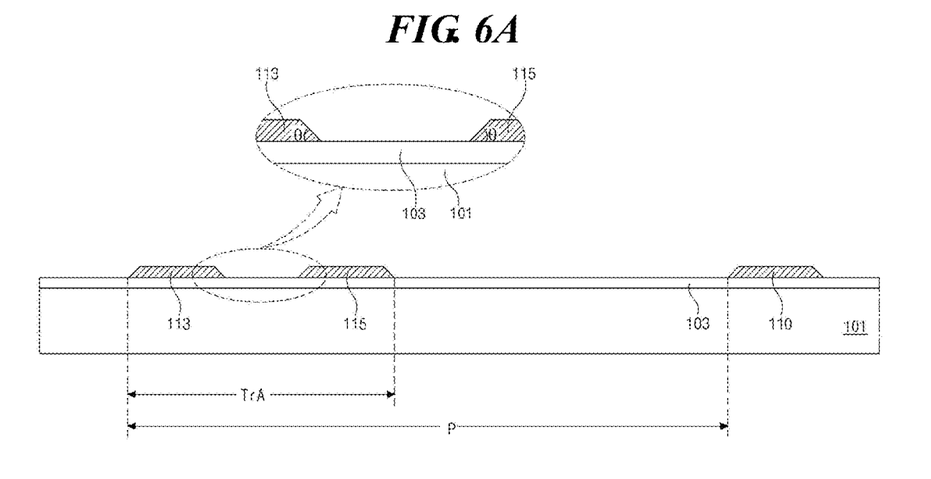
FIGS. 6A to 6F are cross-sectional views illustrating an exemplary method of fabricating an array substrate including an organic TFT according to present invention.

In FIG. 6A, the buffer layer 103 is formed on an entire surface of the substrate 101 by depositing an inorganic insulating material, such as silicon oxide or silicon nitride. Alternatively, the buffer layer 103 can be omitted depending on a material of the substrate 101. The substrate 101 may be formed of glass or plastic to be transparent. A region, where an organic TFT OTr is formed, is defined as a switching region TrA.

Next, a first metal layer (not shown) is formed on the buffer layer 103 by depositing one of gold (Au), silver (Ag), aluminum (Al), Al alloy, copper (Cu), Cu alloy, nickel (Ni) or molybdenum-titanium alloy (MoTi). The aluminum alloy may be aluminum neodymium (AlNd). The first metal layer is patterned by a mask process to form the data line 110, the source electrode 113 and the drain electrode 115. The mask process includes a step of forming a photoresist (PR) layer, a step of exposing the PR layer using an exposing mask, a step of developing the exposed PR layer to form a PR pattern, a step of etching the first metal layer using the PR pattern as an etching mask, and a step of stripping the PR pattern. The data line 110 extends along a boundary of the pixel region P, and the source and drain electrodes 113 and 115 are positioned in the switching region TrA. The source electrode 113 extends from and is connected to the data line 110, and the drain electrode 115 is spaced apart from the source electrode 110. Ends of each of the source and drain electrodes 113 and 115 have a tapered shape with respect to a surface of the buffer layer 103. Namely, a side surface of the ends of the source and drain electrodes 113 and 115 has an acute angle θ of about 10 to 70 degrees with respect to a surface of the buffer layer 103.

A method of forming the source and drain electrodes 113 and 115 is explained in more detail. For example, when the source and drain electrodes 113 and 115 are formed of gold (Au), a PR pattern is formed on the first metal layer of gold (Au) by coating PR material to form a PR layer, exposing the PR layer using an exposing mask, and developing the exposed PR layer to form the PR pattern. The PR pattern corresponds to the data line 110, the source electrode 113, and the drain electrode 115. Next, the first metal layer of gold (Au) is etched with an etchant using the PR pattern as an etching mask. In this case, the etchant has a temperature of about 30° C. to about 50° C. greater than a room temperature. The first metal layer of gold (Au) has an etching rate of about 35 Å/sec to 80 Å/sec with the etchant having the above processing temperature such that ends of the source and drain electrodes 113 and 115 have a tapered shape of an acute angle θ of about 10 to 70 degrees. The PR pattern is then removed.

Figure 6B:
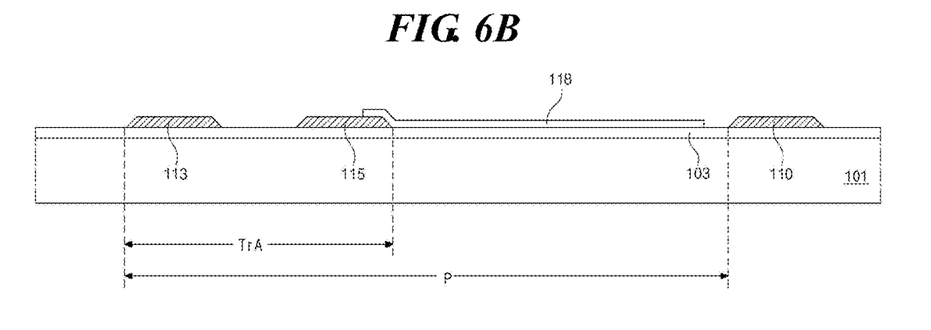

Next, as shown in FIG. 6B, a transparent conductive material layer (not shown) is formed on the source and drain electrodes 113 and 115 and the buffer layer 103 by depositing indium-tin-oxide (ITO) or indium-zinc-oxide (IZO). The transparent conductive material layer is patterned by a mask process to form the pixel electrode 118 in the pixel region P. The pixel electrode 118 contacts an end of the drain electrode 115. Since the end of the drain electrode 115 has a tapered shape, there is no empty space between the end of the drain electrode 115 and the buffer layer 103. Accordingly, the pixel electrode 118 completely contacts a side surface of the drain electrode 115 such that a contact resistance between the drain electrode 115 and the pixel electrode 118 is reduced.

Figure 6C:
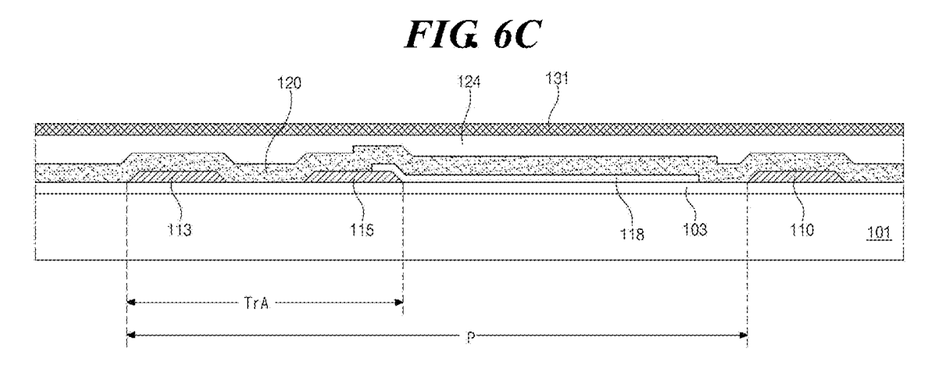

Next, as shown in FIG. 6C, an organic semiconductor material layer 120 is formed on the source and drain electrodes 113 and 115, the buffer layer 103 and the pixel electrode 118 by coating an organic semiconductor material, such as pentacene or polythiophene, of a liquid phase using one of an inkjet apparatus, a nozzle coating apparatus, a bar coating apparatus, a slit coating apparatus, and a spin coating apparatus. Since ends of the source and drain electrodes 113 and 115 have a tapered shape, the organic semiconductor material layer 120 completely contacts side surfaces of the source electrode 113 and a side surface of the drain electrode 115 without an empty space. In addition, since ends of the source and drain electrodes 113 and 115 have a gentle slope of about 10 to 70 degrees with respect a surface of the buffer layer 103, the organic semiconductor material layer 120 has an entirely uniform thickness.

Sequentially, a gate insulating material layer 124 is formed on the organic semiconductor material layer 120 by coating a fluorine-based polymer material or a copolymerized polymer material using a fluorine-based monomer using one of an inkjet apparatus, a nozzle coating apparatus, a bar coating apparatus, a slit coating apparatus, and a spin coating apparatus. The gate insulating material layer 124 has a flat top surface.

Sequentially, a second metal layer 131 is formed on the gate insulating material layer 124 by depositing one of molybdenum (Mo), chromium (Cr), and titanium (Ti). The second metal layer 131 may be dry-etched.

Figure 6D:
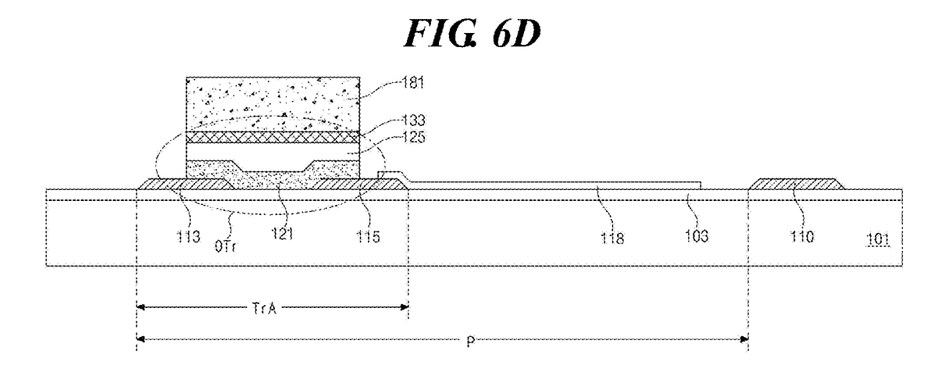

Next, referring to FIG. 6D, a PR layer (not shown) is formed on the second metal layer 131 (of FIG. 6C) by coating a photoresist material having a photosensitive property. The PR layer is exposed and developed to form a PR pattern 181 in the switching region TrA. The PR pattern 181 exposes an outside end of the source electrode 113 and the drain electrode 115 and covers a space between an inside end of the source electrode 113 and the drain electrode 115.

Next, the second metal layer 131 (of FIG. 6C), the gate insulating material layer 124 (of FIG. 6C) and the organic semiconductor material layer 120 (of FIG. 6C) are dry-etched using the PR pattern 181 as a blocking mask, i.e., an etching mask, to form the gate electrode 133, the gate insulating layer 125, and the organic semiconductor layer 121 in the switching region TrA. The gate electrode 133, the gate insulating layer 125, and the organic semiconductor layer 121 have substantially the same shape and area in plane view. In particular, the gate electrode 133, the gate insulating layer 125, and the organic semiconductor layer 121 perfectly overlap one another and have an island shape.

The organic semiconductor material is very weak after being exposed to an etchant. However, the second metal layer 131 (of FIG. 6C), the gate insulating material layer 124 (of FIG. 6C), and the organic semiconductor material layer 120 (of FIG. 6C) are dry-etched, and thus, there is no damage to the organic semiconductor layer.

The source electrode 113, the drain electrode 115, the organic semiconductor layer 121, the gate insulating layer 125 and the gate electrode 133 constitute an organic TFT OTr.

Figure 6E:
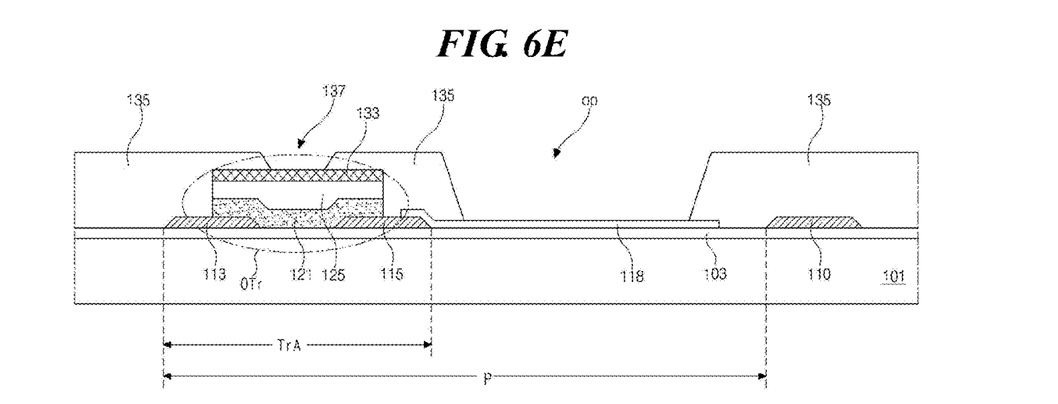

Next, referring to FIG. 6E, the PR pattern 181 (of FIG. 6D) is removed by ashing to expose a top surface of the gate electrode 133. Then, an organic insulating material layer (not shown) is formed on the gate electrode 133, the pixel electrode 118, and the buffer layer 103 by coating an organic insulating material, such as photo-acryl or polyvinyl alcohol (PVA). The organic insulating material layer is patterned to form the first passivation layer 135 including the gate contact hole 137 and the opening op. The gate contact hole 137 exposes the gate electrode 133, and the opening op exposes the pixel electrode 118 in the pixel region P.

Figure 6F:
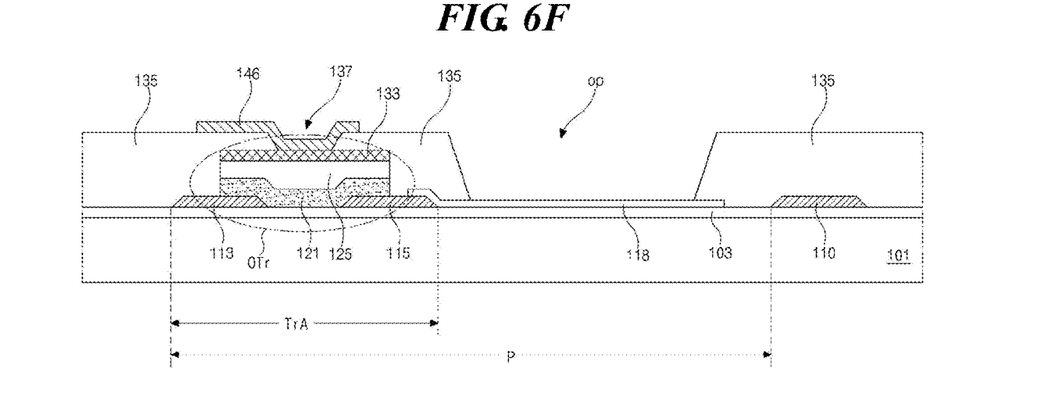

Next, as shown in FIG. 6F, a third metal layer (not shown) is formed on the first passivation layer 135 by depositing one of gold (Au), silver (Ag), copper (Cu), molybdenum-titanium alloy (MoTi), aluminum (Al), aluminum alloy, and nickel (Ni). The aluminum alloy may be aluminum neodymium (AlNd). The third metal layer is patterned by a mask process to form the gate line 146. The gate line 146 contacts the gate electrode 133 through the gate contact hole 137. In addition, the gate line 146 crosses the data line 110 to define the pixel region P.

Although not shown, a portion of the gate line 146 overlaps the pixel electrode 118 such that the overlapped portion of the gate line 146, the overlapped portion of the pixel electrode 118, and the first passivation layer 135 therebetween constitute a storage capacitor.

In addition, after forming the first passivation layer 135 and before forming the third metal layer, an inorganic insulating material layer may be formed by depositing silicon oxide or silicon nitride. The inorganic insulating material layer is patterned to form the second passivation layer. The second passivation layer also includes the gate contact hole 137 exposing the gate electrode 133 and the opening op exposing the pixel electrode 118.

Furthermore, the third passivation layer covering the gate line 146 may be formed by depositing and patterning an inorganic insulating material layer.

The array substrate fabricated through the above processes includes an organic TFT OTr of a top gate type. Since the ends of the source and drain electrodes have a tapered shape, contact resistances between each of the source and drain electrodes and the organic semiconductor layer and between each of the source and drain electrodes and the pixel electrode are reduced. Accordingly, properties of the organic TFT are improved.

Figure 7A:
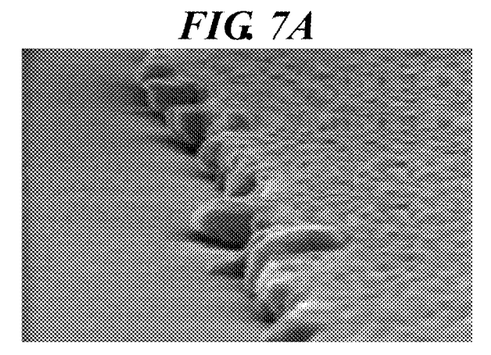
FIGS. 7A to 7C are pictures illustrating an end of a source electrode fabricated under different process conditions.
Figure 7B:
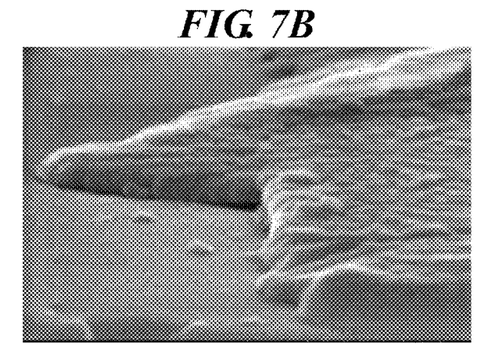
Figure 7C:
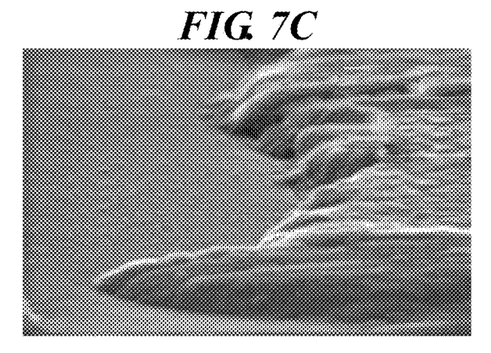

FIGS. 7A to 7C are pictures illustrating an end of a source electrode fabricated under different process conditions.

As shown in FIG. 7A, when the first metal layer of gold (Au) is etched with an etchant of a room temperature, i.e., 25° C., the first metal layer of gold (Au) has an etching rate of about 25 Å/sec such that ends of the source and drain electrodes have a reverse-tapered shape. As shown in FIG. 7B, when the first metal layer gold (Au) is etched with an etchant of a first processing temperature, i.e., 35° C., the first metal layer of gold (Au) has an etching rate of about 35 Å/sec such that ends of the source and drain electrodes have a tapered shape of an acute angle of about 70 degrees. As shown in FIG. 7C, when the first metal layer gold (Au) is etched with an etchant of a second processing temperature, i.e., 43° C., the first metal layer of gold (Au) has an etching rate of about 70 Å/sec such that ends of the source and drain electrodes have a tapered shape of an acute angle of about 30 to 45 degrees.

Accordingly, when the first metal layer is formed of gold (Au), the etchant for etching the first metal layer has a temperature of about 30° C. to about 50° C., preferably about 33° C. to about 50° C., such that ends of the source and drain electrodes have a tapered shape of an acute angle of about 10 to 70 degrees. When the ends of the source and drain electrodes have a tapered shape, there is no empty space between each end of the source and drain electrodes 113 and 115 and the buffer layer 103. Particles in an empty space between each end of the source and drain electrodes and the buffer layer in the related art may be not removed by a cleaning process. However, since there is no empty space between each end of the source and drain electrodes 113 and 115 and the buffer layer 103, particles are completely removed by a cleaning process. The first metal layer of the other materials is etched with an etchant by controlling a temperature of the etchant and increasing the etching rate such that ends of the source and drain electrodes can have a tapered shape.

When the first metal layer is formed of molybdenum (Mo) or molybdenum-titanium alloy (MoTi), which is capable of being dry-etched, a sputter etching process or a chemical etching process is performed with a suitable temperature to etch the first metal layer such that ends of the source and drain electrodes can have a tapered shape. The etching process by the sputter etching process or the chemical etching process has an isotropic property.

Figure 8:
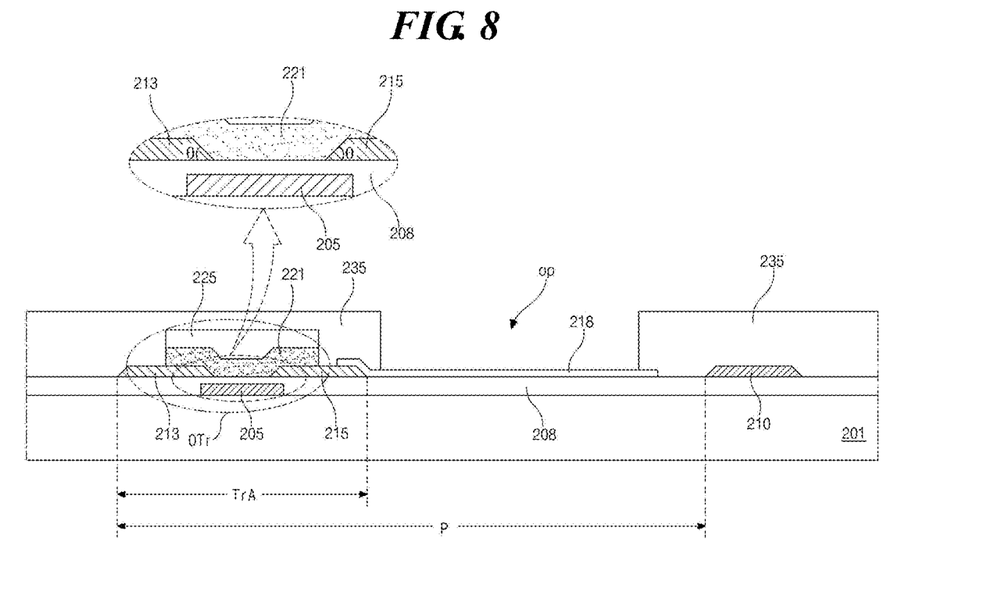
FIG. 8 is a cross-sectional view of an array substrate for an LCD device having an organic TFT according to a second exemplary embodiment of the present invention.

FIG. 8 is a cross-sectional view of an array substrate for an LCD device having an organic TFT according to a second exemplary embodiment of the present invention. In the array substrate shown in FIG. 8, ends of the source and drain electrodes also have a tapered shape.

A gate line (not shown) and a gate electrode 205 are formed on a substrate 201. Each of the gate line and the gate electrode 205 is formed of a first metallic material. For example, gold (Au), silver (Ag), aluminum (Al), Al alloy, copper (Cu), Cu alloy, nickel (Ni) or molybdenum-titanium alloy (MoTi) may be used. The aluminum alloy may be aluminum neodymium (AlNd). The gate electrode 205 is positioned in a switching region TrA and extends from the gate line.

A gate insulating layer 208 is disposed on an entire surface of the substrate 201 where the gate line and the gate electrode 205 are formed. Namely, the gate insulating layer 208 covers the gate line and the gate electrode 205. The gate insulating layer 208 is formed of a fluorine-based polymer material or a copolymerized polymer material using a fluorine-based monomer, each of which has an excellent interface property with an organic semiconductor layer 221. The gate insulating layer 208 has a flat top surface.

A data line 210, a source electrode 213, and a drain electrode 215 are formed on the gate insulating layer 208. Each of the data line 210, the source electrode 213, and the drain electrode 215 is formed of a second metallic material. For example, gold (Au), silver (Ag), aluminum (Al), Al alloy, copper (Cu), Cu alloy, nickel (Ni) or molybdenum-titanium alloy (MoTi) may be used. The aluminum alloy may be aluminum neodymium (AlNd). The data line 210 crosses the gate line to define a pixel region P, and the source and drain electrodes 213 and 215 are positioned in the switching region TrA. The source electrode 213 extends from the data line 210, and the drain electrode 215 is spaced apart from the source electrode 213. A space between the source and drain electrodes 213 and 215 is covered with the gate electrode 205. As mentioned above, the ends of the source and drain electrodes 213 and 215 have a tapered shape of an angle of about 10 to 70 degrees with respect to a surface of the gate insulating layer 208. Namely, there is no empty space between each end of the source and drain electrodes 213 and 214 and a top surface of the gate insulating layer 208.

A pixel electrode 218 is disposed on the gate insulating layer 208. The pixel electrode 218 contacts an end of the drain electrode 215 and is formed of a transparent conductive material. Since the end of the drain electrode 215 has a tapered shape without an empty surface regarding a top surface of the gate insulating layer 208, the pixel electrode 218 completely contacts a side surface of the drain electrode 215.

An organic semiconductor layer 221, which is formed of an organic semiconductor material, such as pentacene or polythiophene, is disposed on the source and drain electrodes 213 and 215 and the gate insulating layer 208. The organic semiconductor layer 221 is positioned in the switching region TrA.

The organic semiconductor layer 221 contacts an inside end of the source electrode 213 and an inside end of the drain electrode 215. The organic semiconductor layer 221 contacts the gate insulating layer 208 exposed between the source and drain electrodes 213 and 215. The organic semiconductor layer 221 is spaced apart from the pixel electrode 218.

Since the ends of the source and drain electrodes 213 and 215 have the tapered shape, particles are perfectly removed by a cleaning process before the step of forming the organic semiconductor layer 221. Accordingly, the organic semiconductor layer 221 has good contact with each of the source and drain electrodes 213 and 215 and a uniform thickness. If the ends of the source and drain electrodes have the reverse-tapered shape, there is an empty space between each of the ends of the source and drain electrodes and the gate insulating layer 208 such that the contact resistance between the organic semiconductor layer and each of the source and drain electrodes is increased. However, since there is no empty space between each of the ends of the source and drain electrodes 213 and 215 and the gate insulating layer 208 of the present embodiment, a contact area between the organic semiconductor layer 221 and each of the source and drain electrodes 213 and 215 is increased such that a contact property between the organic semiconductor layer 221 and each of the source and drain electrodes 213 and 215 is further improved. In addition, since ends of the source and drain electrodes 213 and 215 have a gentle slope of about 10 to 70 degrees with respect a surface of the gate insulating layer 208, the organic semiconductor layer 221 has an entirely uniform thickness.

The gate electrode 205, the gate insulating layer 208, the source electrode 213, the drain electrode 215, and the organic semiconductor layer 221 constitute an organic TFT OTr. A first passivation layer 225 is disposed on the organic semiconductor layer 221. The first passivation layer 225 has substantially the same shape and area as the organic semiconductor layer 221 in the plane view. In particular, the first passivation layer 225 perfectly overlaps the organic semiconductor layer 221. A second passivation layer 235 including an opening op is disposed on the first passivation layer 225. The pixel electrode 218 in the pixel region P is exposed through the opening op.

The array substrate fabricated through the above processes includes an organic TFT OTr of a bottom gate type. Since the ends of the source and drain electrodes have a tapered shape, contact resistances between each of the source and drain electrodes and the organic semiconductor layer and between each of the source and drain electrodes and the pixel electrode are reduced. Accordingly, properties of the organic TFT are improved.

In addition, since the gate electrode 205, which has a width smaller than the organic semiconductor layer 221, covers the space between the source and drain electrodes 213 and 215, a bottom surface of the organic semiconductor layer 221 is not exposed to light from a backlight unit. When the organic semiconductor layer 221 is exposed to light, a problem of photo-current leakage is generated. However, since the bottom surface of the organic semiconductor layer 221 is blocked from the light of the backlight unit due to the source and drain electrodes 213 and 215 and the gate electrode 205, there is no photo-current leakage problem. Accordingly, properties of the organic TFT are not degraded.

A fabricating process of the array substrate according to the second embodiment of the present invention is explained with reference to FIG. 8.

A first metal layer (not shown) is formed on the substrate 201 by depositing the first metallic material. For example, the first metallic material is one of gold (Au), silver (Ag), copper (Cu), molybdenum-titanium alloy (MoTi), aluminum (Al), Al alloy, and nickel (Ni). The aluminum alloy may be aluminum neodymium (AlNd). The first metal layer is patterned by a mask process to form the gate line (not shown) and the gate electrode 205. The gate electrode 205 extends from and is connected to the gate line and is positioned in the switching region TrA.

Next, the gate insulating layer 208 is formed on an entire surface of the substrate 201 by coating one of a fluorine-based polymer material or a copolymerized polymer material, each of which has an excellent interface property with an organic semiconductor layer 221, using a fluorine-based monomer using one of an inkjet apparatus, a nozzle coating apparatus, a bar coating apparatus, a slit coating apparatus, and a spin coating apparatus. The gate insulating layer 208 covers the gate line and the gate electrode 205. The gate insulating layer 208 has a flat top surface.

Next, a second metal layer (not shown) is formed on the gate insulating layer 205 by depositing a second metallic material, for example, gold (Au), silver (Ag), aluminum (Al), Al alloy, copper (Cu), Cu alloy, nickel (Ni) or molybdenum-titanium alloy (MoTi). The aluminum alloy may be aluminum neodymium (AlNd). The second metal layer is patterned by a mask process to form the data line 210, the source electrode 213 and the drain electrode 215. The data line 210 extends along a boundary of the pixel region P, and the source and drain electrodes 213 and 215 are positioned in the switching region TrA. The source electrode 213 extends from and is connected to the data line 210, and the drain electrode 215 is spaced apart from the source electrode 210. Ends of each of the source and drain electrodes 213 and 215 have a tapered shape with respect to a surface of the buffer layer 203. Namely, a side surface of the ends of the source and drain electrodes 213 and 215 has an acute angle θ of about 10 to 70 degrees with respect to a surface of the gate insulating layer 205.

As mentioned above, each of the source and drain electrodes 213 and 215 can have tapered shape ends by controlling a temperature of an etchant or an etching process temperature. For example, when the second metal layer is formed of gold, the etchant, which has a temperature of about 30° C. to about 50° C. greater than a room temperature, is used for etching the second metal layer.

Next, a transparent conductive material layer (not shown) is formed on the source and drain electrodes 213 and 215 and the gate insulting layer 205 by depositing indium-tin-oxide (ITO) or indium-zinc-oxide (IZO). The transparent conductive material layer is patterned by a mask process to form the pixel electrode 218 in the pixel region P. The pixel electrode 218 contacts an end of the drain electrode 215. Since the end of the drain electrode 215 has a tapered shape, there is no empty space between the end of the drain electrode 215 and the gate insulating layer 205. Accordingly, the pixel electrode 218 completely contacts a side surface of the drain electrode 215 such that a contact resistance between the drain electrode 215 and the pixel electrode 218 is reduced.

Next, an organic semiconductor material layer (not shown) is formed on the source and drain electrodes 213 and 215, the gate insulating layer 205 and the pixel electrode 218 by coating an organic semiconductor material, such as pentacene or polythiophene, of a liquid phase using one of an inkjet apparatus, a nozzle coating apparatus, a bar coating apparatus, a slit coating apparatus, and a spin coating apparatus. Since ends of the source and drain electrodes 213 and 215 have a tapered shape, the organic semiconductor material layer completely contacts side surfaces of the source electrode 213 and a side surface of the drain electrode 215 without an empty space. In addition, since ends of the source and drain electrodes 213 and 215 have a gentle slope of about 10 to 70 degrees with respect a surface of the buffer layer 203, the organic semiconductor material layer has an entirely uniform thickness.

Sequentially, an organic insulating material layer (not shown) is formed on the organic semiconductor material layer by coating an organic insulating material, such as polyvinyl alcohol (PVA). Then, the organic insulating material layer and the organic semiconductor material layer are dry-etched to form the organic semiconductor layer 221 and the first passivation layer 225 in the switching region TrA. The organic semiconductor layer 221 contacts an inside end of the source electrode 213 and an inside end of the drain electrode 215 and covers a space between the source and drain electrodes 213 and 215. The organic semiconductor layer 221 has substantially the same shape and area as the first passivation layer 225 in the plane view. In particular, the organic semiconductor layer 221 and the first passivation layer 225 perfectly overlap each other and have an island shape. The organic semiconductor material is very weak when exposed to an etchant. However, since both the organic insulating material layer and the organic semiconductor material layer are dry-etched, there is no damage on the organic semiconductor layer.

Next, an insulating material layer (not shown) is formed on the first passivation layer 225 and the pixel electrode 218 by coating an organic insulating material, such as benzocyclobutene or photo-acryl, or depositing an inorganic insulating material, such as silicon oxide or silicon nitride. The insulating material layer is patterned to form the second passivation layer 235 including the opening op. The pixel electrode 218 in the pixel region P is exposed through the opening op.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate for a liquid crystal display device, the method comprising:

forming a substrate having a pixel region and a switching region;

forming a data line on the substrate;

forming a source electrode and a drain electrode on the switching region of the substrate, the source electrode extending from the data line and being separated from the drain electrode, ends of the source and drain electrodes having an angle smaller than 90 degrees with respect to a surface of the substrate;

forming a pixel electrode in the pixel region of the substrate, the pixel electrode being connected to the drain electrode;

forming an organic semiconductor layer on the source and drain electrodes, the organic semiconductor layer contacting an inside end of each of the source and drain electrodes;

forming a gate insulating layer on the organic semiconductor layer;

forming a gate electrode on the gate insulating layer;

forming a passivation layer on the gate electrode and the data line, the passivation layer including a gate contact hole that exposes the gate electrode and an opening that exposes the pixel electrode; and forming a gate line on the passivation layer and connected to the gate electrode through the gate contact hole.

2. The method of fabricating an array substrate for a liquid crystal display device according to claim 1, wherein the forming the data line, source electrode, and drain electrode further comprises:

forming a metal layer on the substrate by depositing gold;

forming a photoresist pattern on the metal layer that corresponds to the data line, source electrode, and drain electrode;

etching the metal layer using the photoresist pattern as an etching mask with an etchant having a temperature of about 33 to 50° C. to form the data line, source electrode, and drain electrode; and removing the photoresist pattern.

3. The method of fabricating an array substrate for a liquid crystal display device according to claim 1, wherein the forming the data line, source electrode and drain electrode further comprises:

forming a metal layer on the substrate by depositing molybdenum or molybdenum-titanium alloy;

forming a photoresist pattern on the metal layer that corresponds to the data line, source electrode, and drain electrode;

isotropically dry-etching the metal layer using the photoresist pattern as an etching mask by sputter etching or chemical etching to form the data line, source electrode, and drain electrode; and removing the photoresist pattern.

4. The method of fabricating an array substrate for a liquid crystal display device according to claim 1 wherein the forming the organic semiconductor layer, gate insulating layer, and gate electrode comprises:

sequentially forming an organic semiconductor material layer on the source and drain electrode, an organic insulating material layer on the organic semiconductor material layer, and a metal layer on the organic insulating material layer;

forming a photoresist pattern on the metal layer;

dry-etching the metal layer, the organic insulating material layer, and the organic semiconductor material layer using the photoresist pattern as an etching mask to form the organic semiconductor layer, gate insulating layer, and gate electrode; and removing the photoresist pattern.

5. The method of fabricating an array substrate for a liquid crystal display device according to claim 1, further comprising forming a buffer layer on the substrate by depositing an inorganic insulating material prior to the forming the data line, source electrode, and the drain electrode.

6. The method of fabricating an array substrate for a liquid crystal display device according to claim 1, wherein the angle has a range within about 10 to 70 degrees.

* * * * *